United States Patent
Wang et al.

(10) Patent No.: US 12,169,297 B2
(45) Date of Patent: Dec. 17, 2024

(54) POLARIZING STRUCTURE, MODULAR STRUCTURE, AND MANUFACTURING METHOD THEREOF

(71) Applicant: BOE TECHNOLOGY GROUP CO., LTD., Beijing (CN)

(72) Inventors: Haoran Wang, Beijing (CN); Xiongnan Zhang, Beijing (CN); Paoming Tsai, Beijing (CN); Pinfan Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 574 days.

(21) Appl. No.: 17/207,869

(22) Filed: Mar. 22, 2021

(65) Prior Publication Data
US 2022/0082748 A1 Mar. 17, 2022

(30) Foreign Application Priority Data
Sep. 16, 2020 (CN) .......................... 202010973243.9

(51) Int. Cl.
*G02B 5/30* (2006.01)
*H10K 50/80* (2023.01)
*H10K 71/00* (2023.01)

(52) U.S. Cl.
CPC .......... *G02B 5/3041* (2013.01); *G02B 5/3083* (2013.01); *H10K 50/868* (2023.02); *H10K 71/00* (2023.02)

(58) Field of Classification Search
None
See application file for complete search history.

(56) References Cited

U.S. PATENT DOCUMENTS 11,693,269 B2 * 7/2023 Noh ..................... G02F 1/13332
349/56
2016/0259200 A1 * 9/2016 Nishimoto ........ G02F 1/133528
(Continued)

FOREIGN PATENT DOCUMENTS

| CN | 106918859 A | 7/2017 |
| CN | 111048549 A | 4/2020 |

(Continued)

OTHER PUBLICATIONS

First Office Action for CN Patent Application No. 202010973243.9 mailed Nov. 26, 2021.

*Primary Examiner* — Richard H Kim
(74) *Attorney, Agent, or Firm* — XSENSUS LLP

(57) ABSTRACT

The present disclosure relates to the field of display and, in particular, to a polarizing structure, a modular structure, and a manufacturing method thereof. The polarizing structure includes a support film having first and second bonding sides disposed oppositely in the thickness direction thereof, wherein the first bonding side can be bonded to the curved cover plate, and a polarizer bonded on the second bonding side of the support film. An outer contour of the orthographic projection of the support film on a reference plane is located outside the outer contour of the orthographic projection of the polarizer on the reference plane. The minimum distance between the outer contours of the orthographic projections of the support film and the polarizer on the reference plane may be, for example, greater than 0.5 mm. The reference plane is a plane perpendicular to the thickness direction.

10 Claims, 3 Drawing Sheets

(56) References Cited

U.S. PATENT DOCUMENTS

| | | | | |
|---|---|---|---|---|
| 2018/0004037 | A1* | 1/2018 | Park | G02F 1/136286 |
| 2019/0162881 | A1* | 5/2019 | Cammenga | G02B 5/3058 |
| 2020/0170126 | A1* | 5/2020 | Ahn | G06F 1/1637 |
| 2021/0399076 | A1* | 12/2021 | Lee | H10K 59/131 |

FOREIGN PATENT DOCUMENTS

| | | |
|---|---|---|
| CN | 111221163 A | 6/2020 |
| JP | 2010078887 A | 4/2010 |

* cited by examiner

POLARIZING STRUCTURE, MODULAR STRUCTURE, AND MANUFACTURING METHOD THEREOF

CROSS-REFERENCE TO RELATED APPLICATION

The present application claims the benefit of and priority to Chinese Patent Application No. 202010973243.9 filed on Sep. 16, 2020, which is incorporated herein by reference in its entirety for all purposes.

TECHNICAL FIELD

The present disclosure relates to the field of display technology and, in particular, to a polarizing structure, a modular structure, and a manufacturing method thereof.

BACKGROUND

At present, from the perspective of market trends, Organic Light-Emitting Diode (OLED) display devices have become the favored choice for electronic devices, such as mobile phones and tablet computers, because of their good flexibility. OLED display devices can be provided to match a cover plate of different shape models, for example, a curved cover plate, such as a four-sided curved cover plate, thus allowing different requirements of curved surface display.

OLED display devices have high reflectivity to external ambient light due to their structural characteristics. For the purpose of reducing the overall reflectivity, polarizers are usually provided between the cover plate and the OLED display device. However, when the polarizer is bonded to the curved cover plate, corner areas of the polarizer are prone to wrinkles, affecting the display performance.

It should be noted that the information disclosed in the Background section is only used to enhance understanding the background of the present disclosure, and therefore may include information that does not constitute the prior art known to those of ordinary skill in the art.

SUMMARY

A first aspect of the present disclosure provides a polarizing structure, which includes:
a support film, including a first bonding side and a second bonding side that are disposed oppositely to each other in a thickness direction of the support film, wherein the first bonding side can be bonded to a curved cover plate; and
a polarizer, bonded on the second bonding side of the support film,
wherein, the outer contour of the orthographic projection of the support film on a reference plane is located outside the outer contour of the orthographic projection of the polarizer on the reference plane, and a minimum distance between the outer contour of the orthographic projection of the support film on the reference plane and the outer contour of the orthographic projection of the polarizer on the reference plane is greater than 0.5 mm, where the reference plane is a plane perpendicular to the thickness direction.

In an exemplary embodiment of the present disclosure, the elastic modulus of the support film is less than 1 GPa.

In an exemplary embodiment of the present disclosure, the support film is made of polyurethane, polyester, polyether, or silicone rubber.

In an exemplary embodiment of the present disclosure, the thickness of the support film is from 0.2 mm to 0.4 mm.

In an exemplary embodiment of the present disclosure, the elastic modulus of the polarizing structure is less than 1 GPa.

In an exemplary embodiment of the present disclosure, the polarizer includes a linear polarizing layer and a phase retardation layer, wherein the linear polarizing layer is bonded on the second bonding side, and the phase retardation layer is bonded on a side of the linear polarizing layer away from the support film, and wherein the orthographic projection of the linear polarizing layer on the reference plane coincides completely with the orthographic projection of the phase retardation layer on the reference plane.

A second aspect of the present disclosure provides a manufacturing method of a modular structure for a display device. The manufacturing method includes:
providing a curved cover plate;
providing a polarizing structure as described in any of the above embodiments;
bonding the first bonding side of the support film in the polarizing structure to the curved cover plate; and
cutting the support film along a cutting line, wherein in a plane extending along the thickness direction of the support film, the end of the cutting line extends inwards with relative to the end of the outer contour of the support film, and extends outwards with relative to the end of the outer contour of the polarizer.

In an exemplary embodiment of the present disclosure, after cutting the support film along the cutting line, in the plane extending along the thickness direction of the support film, the end of the outer contour of the support film extends outwards with relative to the end of the outer contour of the polarizer by a minimum distance ranging from 0.1 mm to 0.5 mm.

In an exemplary embodiment of the present disclosure, before bonding the first bonding side of the support film in the polarizing structure to the curved cover plate, or after cutting the support film along the cutting line, a display panel is bonded to a side of the polarizer away from the curved cover plate.

A third aspect of the present disclosure provides a modular structure for a display device. The modular structure includes:
a curved cover plate; and
a polarizing structure, including a support film and a polarizer,
wherein the support film includes a first bonding side and a second bonding side disposed oppositely to each other in the thickness direction of the support film, the first bonding side is bonded to the curved cover plate, and the polarizer is bonded on the second bonding side of the support film; and
wherein, in a plane extending along the thickness direction of the support film, the end of the outer contour of the support film extends outwards with relative to the end of the outer contour of the polarizer.

In an exemplary embodiment of the present disclosure, the elastic modulus of the support film is less than 1 GPa.

In an exemplary embodiment of the present disclosure, in a plane extending along the thickness direction of the support film, the end of the outer contour of the support film extends outwards with relative to the end of the outer contour of the polarizer by a minimum distance ranging from 0.1 mm to 0.5 mm.

In an exemplary embodiment of the present disclosure, the curved cover plate includes a central area, first arcuate areas located at opposite sides of the central area in a second direction, second arcuate areas located at opposite sides of the central area in a first direction, and spherical corner areas located between adjacent ones of the first arcuate areas and the second arcuate areas. Any two of the first direction, the second direction and the thickness direction are perpendicular to each other. The radius of curvature of each of the first arcuate areas, the second arcuate areas, and the spherical corner areas is ranging 1 mm to 50 mm. The ratio between the surface area of the spherical corner areas and the surface area of the curved cover plate is less than 15%.

In an exemplary embodiment of the present disclosure, a display panel is further included, wherein the display panel is bonded on a side of the polarizer away from the curved cover plate.

In an exemplary embodiment of the present disclosure, a plurality of through holes are provided on the display panel, and the plurality of through holes divide the display panel into pixel islands for display and bridge portions for signal transmission. The plurality of through holes is arranged around the pixel islands. A part of the bridge portions is located between the pixel islands and the plurality of through holes, and another part of the bridge portions is located between adjacent through holes.

In an exemplary embodiment of the present disclosure, a plurality of signal traces for signal transmission is provided in the bridge portions, and a plurality of pixels is provided in each pixel island.

It should be understood that the above general description and the following detailed description are only exemplary and explanatory, and are not intended to limit the present disclosure.

BRIEF DESCRIPTION OF THE DRAWINGS

The drawings herein are incorporated into the specification and constitute a part of the specification, showing embodiments consistent with the present disclosure, and being used together with the specification to explain the principle of the present disclosure. Understandably, the drawings in the following description are only some embodiments of the present disclosure. For those of ordinary skill in the art, other drawings can be obtained based on these drawings without creative work.

DETAILED DESCRIPTION

Figure 1:
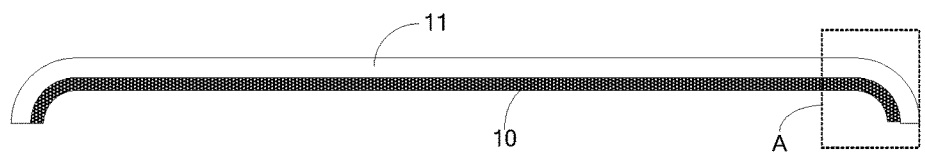
FIG. 1 shows a schematic cross-sectional view of a modular structure according to an embodiment of the present disclosure.

In order to make the objectives, technical solutions, and advantages of the present disclosure clearer, embodiments of the present disclosure will be described in detail below with reference to the accompanying drawings. Note that the embodiments can be implemented in a number of different forms. A person of ordinary skill in the technical field can easily understand that the method and content can be transformed into various forms, without departing from the purpose and scope of the present disclosure. Therefore, the present disclosure should not be interpreted as being limited to the content described in the following embodiments. In the case of no conflict, embodiments in the present disclosure and the features in the embodiments can be combined with each other arbitrarily.

In the drawings, for the sake of clarity, the size of each component, the thickness of the layer, or the area may be exaggerated. Therefore, one embodiment of the present disclosure is not necessarily limited to a special size, and the shape and size of each component in the drawings do not reflect the true ratio. In addition, the drawings schematically show ideal examples, and one aspect of the present disclosure is not limited to the shapes, numerical values, and the like shown in the drawings.

The ordinal numbers such as "first" and "second" in the specification are set to avoid the confusion of the constituent elements, rather than to limit in terms of quantity.

In the specification, for the sake of convenience, words and expressions, such as "inside" and "outside," indicating the orientation or positional relationship are used to explain the positional relationship between the constituent elements shown in the drawings. This is only for the convenience of describing the specification and simplifying the description, rather than indicating that the device or element as referred to must have a specific orientation, be constructed and operated in a specific orientation. Therefore, this cannot be understood as a limitation of the present disclosure. The positional relationship between the constituent elements is appropriately changed according to the direction in which each constituent element is described. Therefore, it is not limited to the words and sentences described in the specification, and can be changed appropriately according to the actual situation.

In the following description, the following reference numerals are used to refer to various components in the present disclosure: 10, polarizing structure; 101, support film; 101a, first bonding side; 101b, second bonding side; 102, linear polarizing layer; 103, phase retardation layer; 104, second adhesive layer; 11, curved cover plate; 12, first adhesive layer; 13, display panel; 14, third adhesive layer; and 15, profiling jig.

An embodiment of the present disclosure provides a polarizing structure 10, which can be applied to a display device, such as an OLED display device. As shown in FIG. 1, the polarizing structure 10 can be bonded to the curved cover plate 11, but is not limited only thereto. Therefore, the polarizing structure 10 can also be bonded to other structures. It should be noted that according to an embodiment of the present disclosure, before the polarizing structure 10 is bonded to the curved cover plate 11, the polarizing structure 10 as a whole can be planar. By contrast, after being bonded to the curved cover plate 11, the overall structural shape of the polarizing structure 10 and the structural shape of the curved cover plate 11 can be the same.

Figure 2:
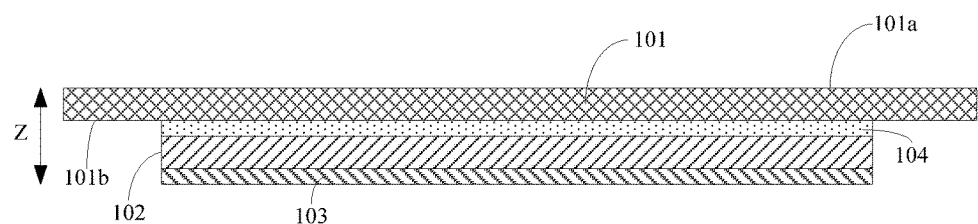
FIG. 2 shows a schematic cross-sectional view of a polarizing structure according to an embodiment of the present disclosure.
Figure 3:
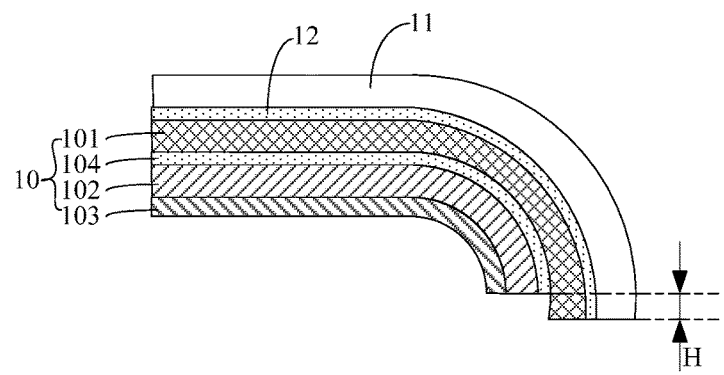
FIG. 3 shows an enlarged schematic structural diagram of the part A of the modular structure shown in FIG. 1.

The polarizing structure according to an embodiment of the present disclosure includes a support film and a polarizer. As shown in FIG. 2, the support film 101 includes a first bonding side 101a and a second bonding side 101b that are disposed oppositely to each other in the thickness direction Z of the support film 101, where the first bonding side 101a can be bonded to the curved cover plate 11. For example, as shown in FIG. 3, the first bonding side 101a of the support film 101 can be bonded to the curved cover plate 11 by the first adhesive layer 12. It should be understood that the first adhesive layer 12 can be made of Optically Clear Adhesive (OCA), which has a certain light transmittance. However, the present disclosure is not limited in this regard, and the first adhesive layer 12 can also be made by other adhesive materials.

The polarizer may be bonded on the second bonding side 101b of the support film 101. For example, the polarizer may be a circular polarizer. As shown in FIG. 2 and FIG. 3, the polarizer may include a linear polarizer layer 102 and a phase retardation layer 103. The linear polarizing layer 102 can be bonded on the second bonding side 101b of the support film 101. The linear polarizing layer 102 can include a polyvinyl alcohol (PVA) optical film. In addition, the polarizer can also include pressure sensitive adhesive, an incremental film, and a Tri Acetate Cellulose (TAC) film, and so on. The linear polarizing layer 102 can be bonded on the second bonding side 101b of the support film 101 by the second adhesive layer 104. It should be understood that the second adhesive layer 104 can be made of Optically Clear Adhesive (OCA, also referred to as Optical glue), which has a certain light transmittance. However, the present disclosure is not limited in this regard, and the second adhesive layer 104 can also be made by other glue or adhesive materials. The phase retardation layer 103 can be bonded on the side of the linear polarizing layer 102 away from the support film 101. For example, the phase retardation layer 103 and the linear polarizing layer 102 can be bonded together by glue.

As shown in FIG. 2, the orthographic projection of the aforementioned linear polarizing layer 102 on the reference plane coincides completely with the orthographic projection of the phase retardation layer 103 on the reference plane. The aforementioned outer contour of the orthographic projection of the support film 101 on the reference plane is located outside the outer contour of the orthographic projection of the polarizer on the reference plane. That is, the outer edge of the support film 101 extends beyond the outer contour of the polarizer, as shown in FIG. 2. Specifically, the minimum distance between the outer contour of the orthographic projection of the support film 101 on the reference plane and the outer contour of the orthographic projection of the polarizer on the reference plane is greater than 0.5 mm.

It should be noted that the polarizer is not limited to the aforementioned circular polarizer, and may also be of other types, depending on the specific circumstances. In addition, the reference plane mentioned in embodiments of the present disclosure is a plane perpendicular to the thickness direction Z of the support film 101.

In an embodiment of the present disclosure, the support film 101 is provided on a side of the polarizer that can be bonded to the curved cover plate 11, and the outer contour of the support film 101 exceeds beyond the outer contour of the polarizer. In this way, when the polarizer and the curved cover plate 11 is bonded to each other, the outer edge of the support film 101 can apply a certain stretching force on the polarizer so as to improve the wrinkle phenomenon occurred while the polarizer is being bonded. That is, the flatness of the polarizer can be improved, and the polarizer and thus the display can be improved in performance.

In addition, the outer contour of the support film 101 is configured to exceed beyond the outer contour of the polarizer. In this case, according to an embodiment of the present disclosure, when the polarizing structure 10 is bonded to the curved cover plate 11, wrinkles can be concentrated on the edge of the support film 101. After that, it is only needed to remove those parts of the support film 101 with wrinkles, without affecting the polarizer in performance.

In an embodiment of the present disclosure, the elastic modulus of the support film 101 can be less than 1 GPa. This can improve the stretching, bending, and deformation ability of the support film 101, so as to help removing the wrinkles occurred in the corner areas when the polarizing structure 10 is bonded to the curved cover plate 11.

In addition, the elastic modulus of the support film 101 is configured to be less than 1 Gpa, allowing to reduce the elastic modulus of the entire polarizing structure 10. Further, the elastic modulus of the entire polarizing structure 10 is also configured to be less than 1 Gpa. This can increase the stretching, bending, and deformation ability of the entire polarizing structure 10, so as to help remove the folds that occur in the corner areas when the polarizing structure 10 is bonded to the curved cover plate 11.

In some embodiments, the aforementioned support film 101 may be made of polyurethane, polyester, polyether, or silicone rubber, so as to reduce the overall elastic modulus of the support film 101. However, the present disclosure is not limited in this regard, and the support film 101 may also be made by other materials as long as that the support film 101 is ensured to have a small elastic modulus and also good stretchability, bending, and deformation capabilities.

In an embodiment of the present disclosure, the thickness of the support film 101 may be from 0.2 mm to 0.4 mm, such as 0.2 mm, 0.25 mm, 0.3 mm, 0.4 mm, etc. Thus, it is ensured that the support film 101 has a small elastic modulus. However, the present disclosure is not limited in this regard, and the support film 101 may also have other thicknesses, as long as that the support film 101 is ensured to have a small elastic modulus and also good stretchability, bending, and deformation capabilities.

Figure 4:
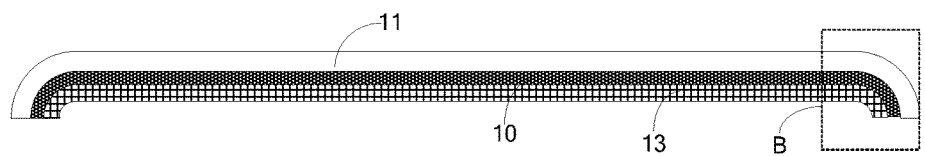
FIG. 4 shows a schematic cross-sectional view of a modular structure according to another embodiment of the present disclosure.

It should be noted that, as shown in FIG. 4, in an embodiment of the present disclosure, the polarizing structure 10 is usually disposed between the display panel 13 and the curved cover plate 11. In order to ensure the overall light transmittance of the polarizing structure 10, the light transmittance of the support film 101 is made greater than 90%.

An embodiment of the present disclosure may also provide a polarizing structure. The polarizing structure does not include the support film 101, but only includes the aforementioned polarizer. The elastic modulus of the polarizing structure can be less than 1 GPa, so as to reduce the elastic modulus of the overall polarizing structure. This helps to improve the stretching, bending and deformation capabilities of the entire polarizing structure, and further helps to avoid the wrinkles occurred in the corner areas when the polarizing structure is bonded to the curved cover plate.

Figure 7:
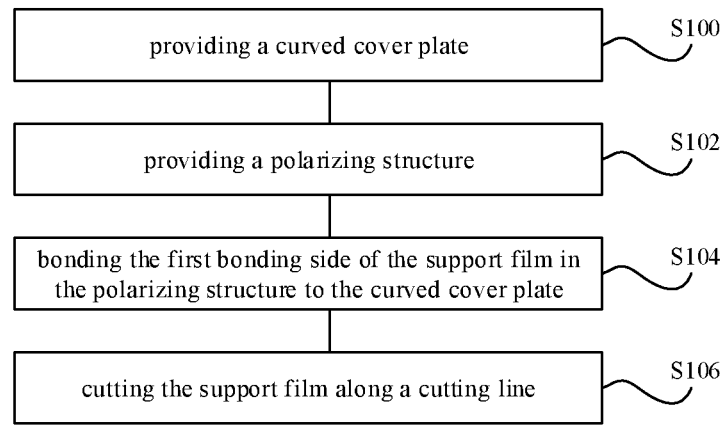
FIG. 7 shows a flowchart of a method for manufacturing a modular structure according to an embodiment of the present disclosure.

An embodiment of the present disclosure also provides a manufacturing method of a modular structure for a display device. As shown in FIG. 7, the manufacturing method may include the following steps.

Figure 8:
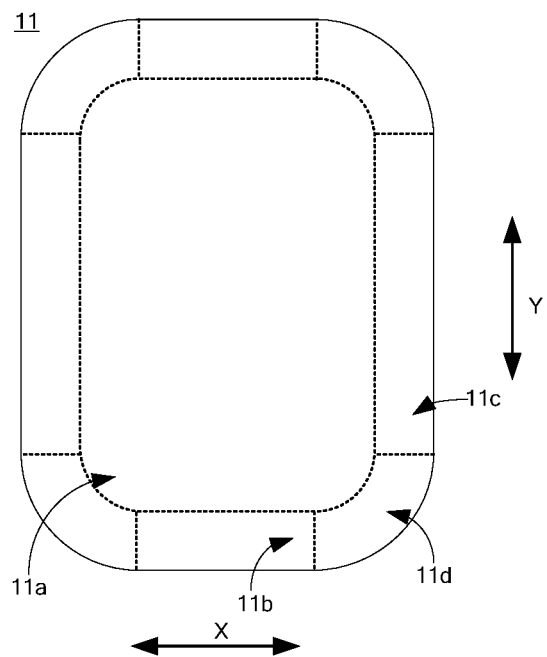
FIG. 8 shows a schematic top view of a curved cover plate according to an embodiment of the present disclosure.

In step S100, a curved cover plate 11 is provided. At least part of the curved cover plate 11 may be spherical. For example, the curved cover plate 11 may be a quadrilateral curved cover plate. Specifically, as shown in FIG. 8, the curved cover plate 11 may include a central area 11a, first arcuate areas 11b located at opposite sides of the central area 11a in a second direction Y, second arcuate areas 11c located at opposite sides of the central area 11a in a first direction X, and spherical corner areas 11d located between adjacent ones of the first arcuate areas 11b and the second arcuate areas 11c. The central area 11a can be flat, but is not limited to this. For example, the central area 11a can also be spherical. It should be noted that, the second direction Y is perpendicular to the first direction X, and both the second direction Y and the first direction X are perpendicular to the thickness direction Z. It should be also noted that, the curved cover plate 11 is not limited to the aforementioned shape, and may also have other shapes. For example, only a pair of adjacent sides is curved. Further, the radius of curvature of each of the first arcuate areas 11b, the second arcuate areas 11c, and the spherical corner areas 11d may be from 1 mm to 50 mm, such as 1 mm, 5 mm, 10 mm, 20 mm, 30 mm, 40 mm, 50 mm, etc. Further, the ratio between the surface area of the spherical corner areas and the surface area of the curved cover plate may be less than 15%.

In step S102, a polarizing structure 10 is provided. The polarizing structure 10 may be the polarizing structure 10 described in any of the foregoing embodiments, as shown in FIG. 2, and will not be described in detail here.

Figure 6:
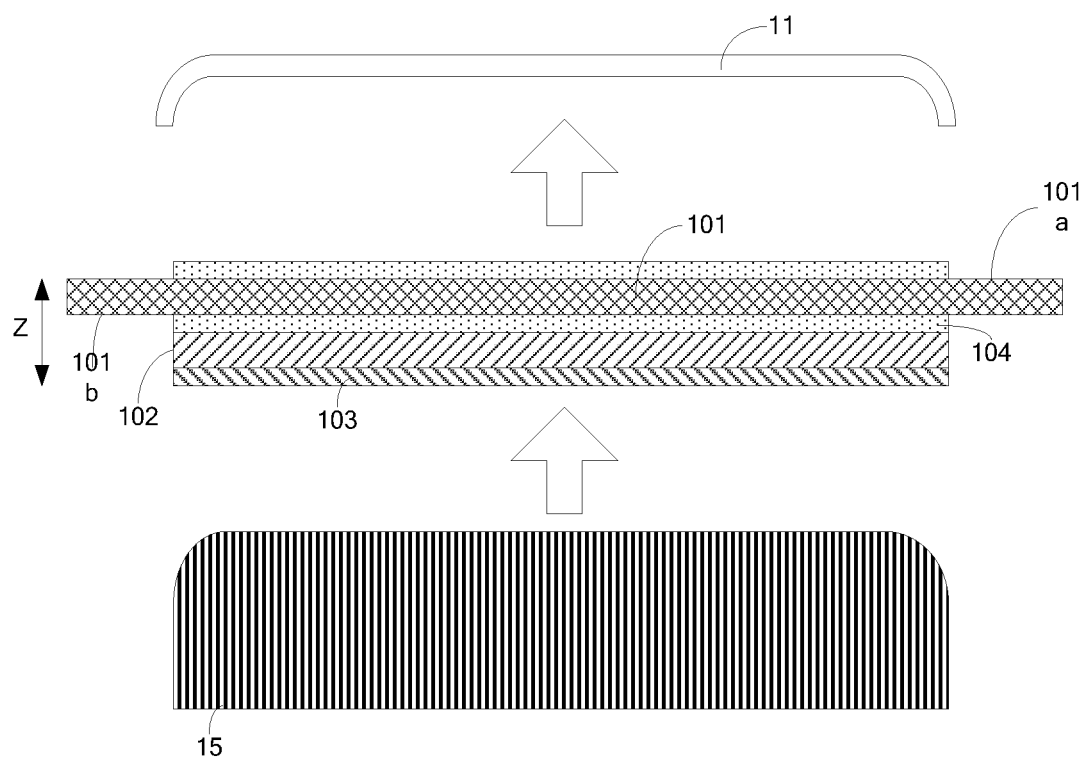
FIG. 6 shows a schematic diagram of the bonding process between the polarizing structure and the curved cover plate according to an embodiment of the present disclosure.

In step S104, the first bonding side 101a of the support film 101 in the polarizing structure 10 is bonded to the curved cover plate 11. For example, the first bonding side 101a of the support film 101 in the polarizing structure 10 can be provided with an adhesive layer, wherein the adhesive layer can be the aforementioned first adhesive layer 12. Then, the polarizing structure 10 is bonded to the curved cover plate 11 using a profiling jig 15. As shown in FIG. 6, the profiling jig 15 can be placed on a side of the polarizing structure 10 away from the curved cover plate 11, and then the profiling jig 15 can be driven to move closer to the inner surface of the curved cover plate 11 (the moving direction is the direction indicated by the hollow arrow in FIG. 6), so as to drive the polarizing structure 10 to move toward the inner surface of the curved cover plate 11. In this way, at least part of the polarizing structure 10 is located in the inner surface of the curved cover plate 11 and is bonded to the inner surface of the curved cover plate 11. It should be noted that the contour of the support surface of the profiling jig 15 for supporting the polarizing structure 10 and the contour of the inner surface of the curved cover plate 11 can be the same. In addition, the way for bonding the polarizing structure 10 and the curved cover plate 11 is not limited only to the above. For example, the flat or arcuate areas of the polarizing structure 10 and the curved cover plate 11 can be bonded to each other first, and then the spherical corner areas of the polarizing structure 10 and the curved cover plate 11 can be bonded to each other.

In step S106, the support film 101 is cut along the cutting line where, in a plane extending along the thickness direction of the support film, the end of the cutting line extends inwards with relative to the end of the outer contour of the support film, and extends outwards with relative to the end of the outer contour of the polarizer, as shown in FIGS. 1 and 3.

In an embodiment of the present disclosure, the outer contour of the support film 101 in the polarizing structure 10 exceeds beyond the outer contour of the polarizer. Thus, when the polarizing structure 10 is bonded to the curved cover plate 11, the outer edge of the support film 101 will apply a certain stretching force on the polarizer, so as to alleviate the wrinkle phenomenon while bonding the polarizer. That is, the flatness of the polarizer can be improved, so that the polarizer and thus the display can be provided with improved performance. In addition, the outer contour of the support film 101 exceed beyond the outer contour of the polarizer. In this case, when the polarizing structure 10 according to an embodiment of the present disclosure is bonded to the curved cover plate 11, wrinkles will be concentrated on the edge of the support film 101. After that, it is needed to remove parts of the support film 101 with folds, without affecting the performance of the polarizer.

It should be noted that, as mentioned above, in the plane extending along the thickness direction of the support film, the end of the cutting line extends inwards with relative to the end of the outer contour of the support film, and extends outwards with relative to the outer contour of the polarizer. The support film 101 is cut along the cutting line. While cutting off the edge part where the wrinkles in the support film 101 are concentrated, the polarizer can be also be prevented from being cut during the cutting process so as to ensure the polarizer in performance.

For example, after cutting the support film 101 along the cutting line, as shown in FIG. 3, in a plane extending along the thickness direction of the support film, the end of the outer contour of the support film extends outwards with relative to the end of the outer contour of the polarizer by a minimum distance H being from 0.1 mm to 0.5 mm, such as 0.1 mm, 0.2 mm, 0.3 mm, 0.4 mm, 0.5 mm, etc. But the present disclosure is not limited to in this regard, and the minimum distance H can be other values, depending on the specific situation.

It should be noted that before cutting the support film 101 along the cutting line, in a plane extending along the thickness direction of the support film, the end of the outer contour of the support film extends outwards with relative to the end of the outer contour of the polarizer by a minimum distance greater than 0.5 mm. For example, it can be several millimeters or more than ten millimeters. That is to say, the part of the support film 101 that exceeds beyond the polarizer before cutting is larger than the part of the support film 101 that exceeds beyond the polarizer after cutting. In this way, after the polarizing structure 10 is bonded to the curved cover plate 11, the wrinkles can be concentrated at the edge of the support film 101. Thus, the part where the wrinkles appear in the support film 101 can be smoothly removed, without affecting the performance of the polarizer.

As mentioned above, in a plane extending along the thickness direction of the support film, the end of the cutting line extends inwards with relative to the end of the outer contour of the support film or coincides with the end of the outer contour of the support film. That is, after cutting the support film 101 along the cutting line, in a plane extending in the thickness direction of the support film, the end of the support film 101 extends inwards with relative to the end of the outer contour of the curved cover plate 11 or coincide with it. In this way, the outer contour shape of the modular structure is made to be the outer contour shape of the curved cover plate 11, so as to ensure the modular structure in appearance and texture.

Figure 5:
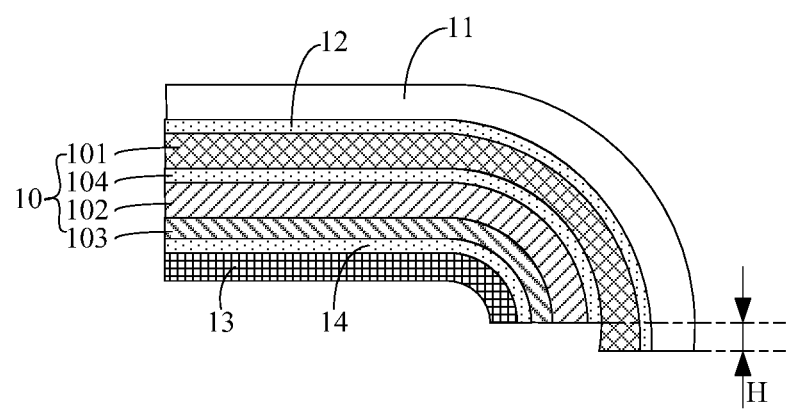
FIG. 5 shows an enlarged schematic structural diagram of the part B of the modular structure shown in FIG. 4.

In an embodiment of the present disclosure, before the first bonding side 101a of the support film 101 in the polarizing structure 10 is bonded to the curved cover plate 11, the manufacturing method of the modular structure may further include step S103, where the display panel 13 is bonded to a side of the polarizer away from the curved cover plate 11. For example, as shown in FIG. 5, the display panel 13 can be bonded on a side of the phase retardation layer 103 far away from the curved cover plate 11 by the third adhesive layer 14.

In another embodiment of the present disclosure, after the support film 101 is cut along the cutting line, the manufacturing method of the modular structure may further include step S108, where the display panel 13 is bonded on a side of the polarizer away from the curved cover plate 11. For example, as shown in FIG. 5, the display panel 13 can be bonded to a side of the phase retardation layer 103 away from the curved cover plate 11 by the third adhesive layer 14.

Based on the two embodiments mentioned above, the display panel 13 can be bonded to the polarizing structure 10 before the polarizing structure 10 and the curved cover plate 11 are bonded to each other, or after the polarizing structure 10 and the curved cover plate 11 are bonded to each other. This depends on the specific situation.

For example, the aforementioned display panel 13 may be an OLED display, but it is not limited to this. The display panel 13 may have good bending and stretching capability. For the purpose of improving the stretching capability of the display panel 13 to elevate the wrinkles that are likely to occur when the display panel 13 is bonded to the curved cover plate 11, in an embodiment of the present disclosure, a plurality of through holes may be provided on the display panel 13, wherein the plurality of through holes can be configured to divide the display panel 13 into pixel islands for display and bridge portions for signal transmission. The plurality of through holes is arranged around the pixel islands. A part of the bridge portions is located between the pixel islands and the through holes, and the other part of the bridge portions is located between the adjacent through holes. The bridge portions may be provided with a plurality of signal traces for signal transmission. Each pixel island can be provided with multiple pixels, such as red pixels, green pixels, blue pixels, etc., and each pixel can include an OLED display device, which can be connected electrically with the signal trances for luminous display.

It should be noted that each pixel island may be surrounded by four through holes, and the through holes may be strip-shaped holes, but not limited to this. The through holes may also be composed of multiple strip-shaped holes giving together a "⊥"-shaped hole.

In addition, in order to avoid a situation where the display panel 13 is prone to wrinkles in the corner areas, grooves etc. may be provided on the flexible polyimide (PI) substrate in the corner area of the display panel 13, so as to further improve the stretchability and bendability of the display panel 13.

An embodiment of the present disclosure also provides a modular structure for a display device. The modular structure can be manufactured by using the manufacturing method of the modular structure described in any of the foregoing embodiments, but is not limited thereto. In detail, in an embodiment of the present disclosure, as shown in FIGS. 1 and 3, the modular structure includes a curved cover plate 11 and a polarizing structure 10. For example, the curved cover plate 11 may be the aforementioned four-sided curved cover plate, and the polarizing structure 10 may include a support film 101 and a polarizer. As shown in FIG. 2, the support film 101 includes a first bonding side 101a and a second bonding side 101a that are arranged oppositely to each other in the thickness direction Z. The first bonding side 101a is bonded to the curved cover plate 11, and the polarizer is bonded to the second bonding side 101b of the support film 101.

As shown in FIG. 3, in a plane extending along the thickness direction of the support film 101, the end of the outer contour of the support film 101 extends outwards with relative to the end of the outer contour of the polarizer. Specifically, in a plane extending along the thickness direction of the support film 101, the end of the outer contour of the support film 101 extends outwards with relative to the end of the outer contour of the polarizer by a minimum distance H that may be from 0.1 mm to 0.5 mm, such as 0.1 mm, 0.2 mm, 0.3 mm, 0.4 mm, 0.5 mm, etc. But the present disclosure is not limited in this regard, and the minimum distance H can also be other values, depending on the specific situation.

It should be noted that the elastic modulus, thickness range, and material of the support film 101 in the polarizing structure 10 of the modular structure as mentioned in embodiments of the present disclosure can be the same or similar as those mentioned in the foregoing embodiments, and will not be detailed here. For the polarizer mentioned in an embodiment of the present disclosure, reference may be made to the structure described in the foregoing embodiments, and details are not repeated here.

In addition, as shown in FIGS. 4 and 5, the modular structure according to an embodiment of the present disclosure may further include a display panel 13. The display panel 13 may be bonded to a side of the polarizer away from the curved cover plate 11. For example, the display panel 13 can be bonded to a side of the phase retardation layer 103 away from the curved cover plate 11 through the third adhesive layer 14. It should be noted that the display panel 13 can be bonded to the polarizing structure 10 by the aforementioned manufacturing method of the modular structure, and the display panel 13 can be the structure as mentioned in the aforementioned embodiments, which will not be detailed here.

An embodiment of the present disclosure also provides a display device, which includes the modular structure as described in any of the foregoing embodiments.

In an embodiment of the present disclosure, the specific type of the display device is not particularly limited. The types of display devices commonly used in the relevant field can be used, such as televisions, mobile phones, computers, watches, etc. Choices can be made by those skilled in the art based on the specific use of the display devices, which won't be repeated here.

It should be noted that, in addition to the modular structure, the display device also includes other necessary parts and components. Taking TV as an example, components such as housing, circuit board, power cord, etc can be also comprised. Supplementations can be made by those skilled in the art based on the specific usage requirements of the electronic device, which will not be repeated here.

Those skilled in the art will easily think of other embodiments of the present disclosure after considering the specification and practicing the invention disclosed herein. The present disclosure is intended to cover any variations, uses, or adaptive changes of the present disclosure. These variations, uses, or adaptive changes follow the general principles of the present disclosure, and include common knowledge or conventional technical means in the technical field that are not disclosed in the present disclosure. The description and the embodiments are only regarded as exemplary, and the true scope and spirit of the present disclosure are indicated by the appended claims.

The invention claimed is:

1. A manufacturing method of a modular structure for a display device, comprising:
   providing a curved cover plate;
   providing a polarizing structure, wherein the polarizing structure comprises:
   a support film, comprising a first bonding side and a second bonding side disposed oppositely to each other in a thickness direction of the support film, wherein the first bonding side is capable of being bonded to the curved cover plate; and a polarizer, bonded on the second bonding side of the support film, wherein an outer contour of an orthographic projection of the support film on a reference plane is located outside an outer contour of an orthographic projection of the polarizer on the reference plane, and a minimum distance between the outer contour of the orthographic projection of the support film on the reference plane and the outer contour of the orthographic projection of the polarizer on the reference plane is greater than 0.5 mm, where the reference plane is a plane perpendicular to the thickness direction;

bonding the first bonding side of the support film in the polarizing structure to the curved cover plate; and cutting the support film along a cutting line, wherein in a plane extending along the thickness direction of the support film, an end of the cutting line extends inwards with relative to an end of an outer contour of the support film, and extends outward with relative to an end of an outer contour of the polarizer, wherein after cutting the support film along the cutting line, in the plane extending along the thickness direction of the support film, the end of the outer contour of the support film extends outward with relative to the end of the outer contour of the polarizer by a minimum distance ranging from 0.1 mm to 0.5 mm.

2. The manufacturing method according to claim 1, further comprising:

before bonding the first bonding side of the support film in the polarizing structure to the curved cover plate, or after cutting the support film along the cutting line, bonding a display panel to a side of the polarizer away from the curved cover plate.

3. The manufacturing method according to claim 2, wherein the display panel is provided with a plurality of through holes, and the plurality of through holes is configured to divide the display panel into pixel islands for display and bridge portions for signal transmission, wherein the plurality of through holes are arranged around the pixel islands, and a part of the bridge portions is located between the pixel islands and the plurality of through holes, and another part of the bridge portions is located between adjacent through holes.

4. The manufacturing method according to claim 3, wherein a plurality of signal traces for signal transmission are provided in the bridge portions, and a plurality of pixels are provided in each pixel island.

5. The manufacturing method according to claim 1, wherein the curved cover plate comprises a central area, first arcuate areas located at opposite sides of the central area in a second direction, second arcuate areas located at opposite sides of the central area in a first direction, and spherical corner areas located between adjacent ones of the first arcuate areas and the second arcuate areas, any two of the first direction, the second direction and the thickness direction are perpendicular to each other, radius of curvature of each of the first arcuate areas, the second arcuate areas and the spherical corner areas ranges from 1 mm to 50 mm; and a ratio in surface area between the spherical corner areas and the curved cover plate is less than 15%.

6. The manufacturing method according to claim 1, wherein the support film has an elastic modulus less than 1 GPa.

7. The manufacturing method according to claim 6, wherein the support film is made of polyurethane, polyester, polyether or silicone rubber.

8. The manufacturing method according to claim 6, wherein the support film has a thickness ranging from 0.2 mm to 0.4 mm.

9. The manufacturing method according to claim 6, wherein the polarizing structure has an elastic modulus less than 1 GPa.

10. The manufacturing method according to claim 1, wherein the polarizer comprises a linear polarizing layer and a phase retardation layer, wherein the linear polarizing layer is bonded on the second bonding side, and the phase retardation layer is bonded on a side of the linear polarizing layer away from the support film; and in the plane extending along the thickness direction of the support film, an outer contour of the linear polarizing layer completely overlap with an outer contour of the phase retardation layer.

* * * * *